(12) United States Patent
Matsui

(10) Patent No.: US 7,883,985 B2
(45) Date of Patent: Feb. 8, 2011

(54) CHIP AND MULTI-CHIP SEMICONDUCTOR DEVICE USING THE CHIP, AND METHOD FOR MANUFACTURING SAME

(75) Inventor: Satoshi Matsui, Kanagawa (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 0 days.

(21) Appl. No.: 11/518,274

(22) Filed: Sep. 11, 2006

(65) Prior Publication Data

US 2007/0004084 A1      Jan. 4, 2007

Related U.S. Application Data

(62) Division of application No. 11/041,241, filed on Jan. 25, 2005, now Pat. No. 7,122,912.

(30) Foreign Application Priority Data

Jan. 28, 2004    (JP) .............................. 2004-020444

(51) Int. Cl.
    *H01L 21/76* (2006.01)
(52) U.S. Cl. ..................... 438/401; 438/462; 438/975
(58) Field of Classification Search .............. 438/401, 438/462, 975, FOR. 435
    See application file for complete search history.

(56) References Cited

U.S. PATENT DOCUMENTS

| | | | | |
|---|---|---|---|---|
| 6,080,659 | A * | 6/2000 | Chen et al. | 438/633 |
| 6,087,719 | A | 7/2000 | Tsunashima | |
| 6,240,791 | B1 * | 6/2001 | Kenney | 73/864.14 |
| 6,809,421 | B1 | 10/2004 | Hayasaka et al. | |
| 6,841,469 | B2 | 1/2005 | Sawada et al. | |
| 7,005,355 | B2 * | 2/2006 | Kleint et al. | 438/287 |
| 7,161,231 | B2 * | 1/2007 | Koike | 257/620 |

(Continued)

FOREIGN PATENT DOCUMENTS

JP      10-303364      11/1998

(Continued)

OTHER PUBLICATIONS

Japanese Office Action dated Aug. 12, 2008 with partial English translation.

*Primary Examiner*—N Drew Richards
*Assistant Examiner*—Joannie A Garcia
(74) *Attorney, Agent, or Firm*—McGinn IP Law Group, PLLC

(57) ABSTRACT

The chip for the multi-chip semiconductor device having the markings for alignment formed on the front surface and/or the back surface of the chip only by the processing from the front surface of the chip (photolithography, etch) and the method for manufacturing same are presented, without adding any dedicated process step to the formation process for the marking for alignment. In the chip for the multi-chip semiconductor device having two or more electroconductive through plug in one chip for the multi-chip semiconductor device, one or more electroconductive through plugs are employed for the marking for alignment, and the chip is configured to allow identification of the marking for alignment on the front surface and/or the back surface of the chip for the multi-chip semiconductor device. Then, an insulating film is provided on the front surface and/or the back surface of the electrically conducting through plug.

15 Claims, 9 Drawing Sheets

U.S. PATENT DOCUMENTS

2001/0029070 A1* 10/2001 Yamazaki et al. ............ 438/149
2003/0151069 A1* 8/2003 Sugimae et al. ............. 257/200
2004/0094511 A1* 5/2004 Seo et al. ...................... 216/83

FOREIGN PATENT DOCUMENTS

| JP | 2000-228487 | 8/2000 |
| --- | --- | --- |
| JP | 2000-228488 | 8/2000 |
| JP | 2001-217387 | 8/2001 |
| JP | 2002-76247 | 3/2002 |
| JP | 2003-197855 | 7/2003 |
| JP | 2003-218138 | 7/2003 |

* cited by examiner

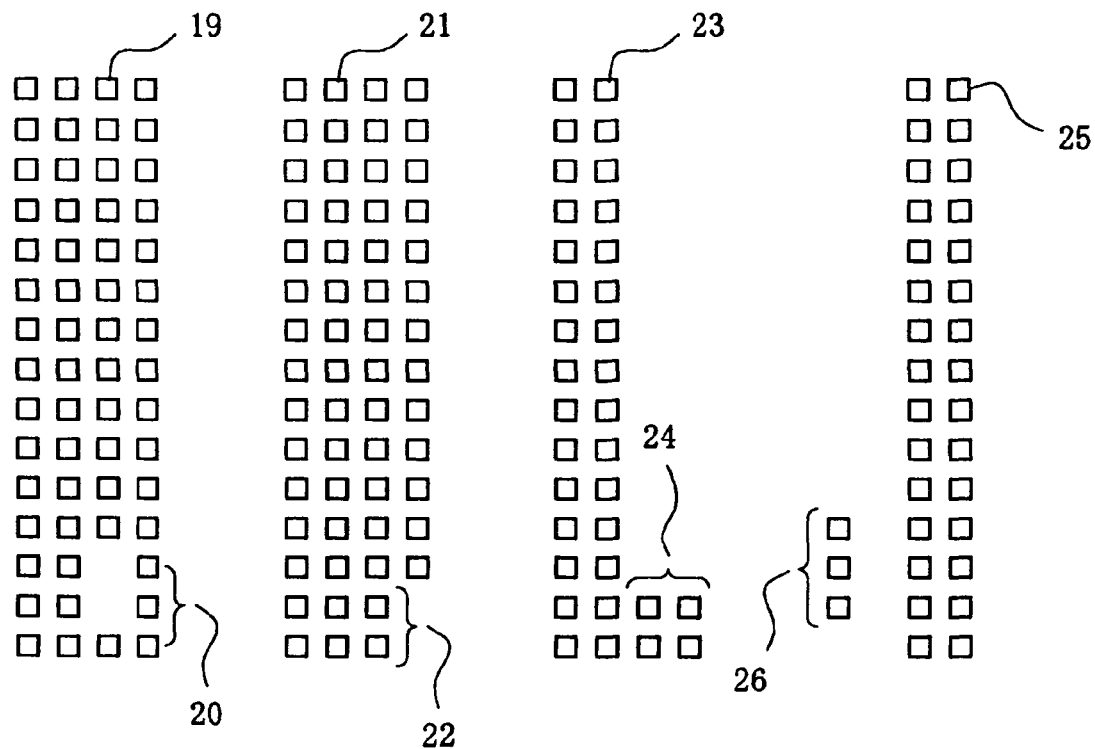
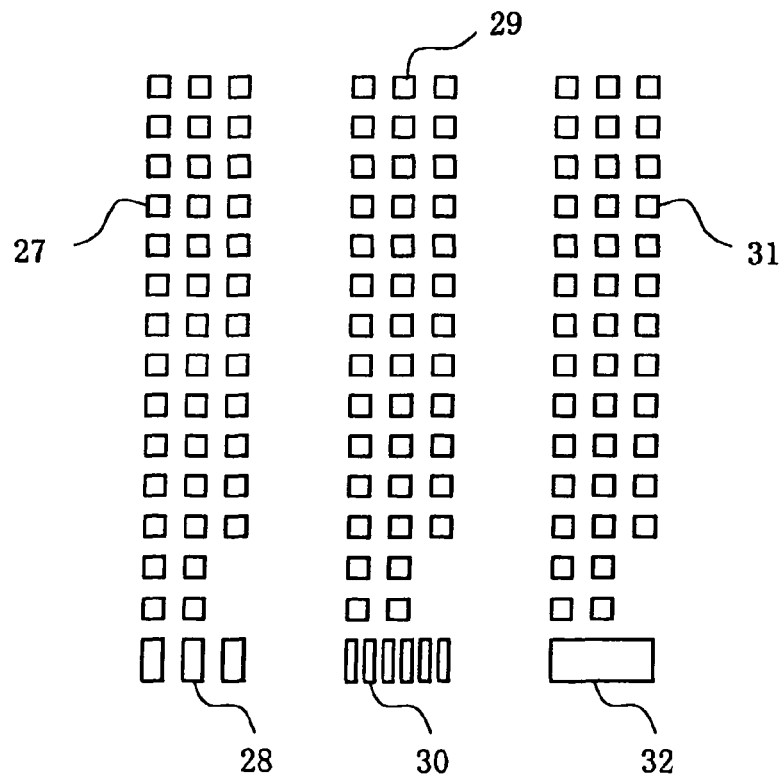
FIG. 4A  FIG. 4B  FIG. 4C  FIG. 4D
FIG. 4E  FIG. 4F  FIG. 4G

CHIP AND MULTI-CHIP SEMICONDUCTOR DEVICE USING THE CHIP, AND METHOD FOR MANUFACTURING SAME The present application is a Divisional application of U.S. patent application Ser. No. 11/041,241, filed on Jan. 25, 2005, now U.S. Pat. No. 7,122,912.

The present application is based on Japanese Patent Application No. 2004-020444, the whole disclosure of which is hereby incorporated by reference.

BACKGROUND OF THE INVENTION

1. Field of the Invention

The present invention relates to a chip for a multi-chip semiconductor device having a marking for alignment and a multi-chip semiconductor device employing thereof, and to a method for manufacturing same.

2. Background of the Art

In recent years, semiconductor chips (hereinafter referred to as simply "chips") having very large scale integrated circuit (VLSI) are frequently employed for forming critical portions in computers and communication equipments. The conformation of forming a stacked body of a plurality of chips is often employed among the usage of such chips. Here, when a plurality of chip is employed to form a stacked body, the particularly critical point may be how the positions of the respective chips are adjusted, or namely the method for the alignment.

Following methods for establishing an alignment in the multiple-chip stacked semiconductor device are known.

Japanese Patent Laid-Open No. H10-303,364 (1998) discloses a method for establishing an alignment of chips, in which through holes of free of embedded material or through holes having a transparent material embedded therein are provided in the respective chips for forming the multi-layered stacked body, the through holes are irradiated with a laser beam from the lower direction and the irradiating laser beam is received by a photodetector that is provided at an upper side, and then the respective chips are moved so that the maximum intensity of the transmitted light are obtained to achieve the alignment of the upper and the lower chips.

Japanese Patent Laid-Open No. 2000-228,487 also discloses a method for establishing an alignment of chips, in which markings are drawn by using a printer or a laser marker on the backside of the chips that are flip chip-bonded in a face down orientation when the multi-chip module having a chip-on-chip structure is manufactured, and then the markings are employed as markings for achieving an alignment.

Japanese Patent Laid-Open No. 2000-228,488 also discloses a method for establishing an alignment of chips, in which electrode markings are drawn on the backside of the chips that are flip chip-bonded in a face down orientation, corresponding to the positions of the electrodes on the surfaces of the chips, when the multi-chip module having a chip-on-chip structure is manufactured, and then the markings are employed as markings for achieving an alignment.

Japanese Patent Laid-Open No. 2001-217,387 also discloses a method for establishing an alignment of chips, in which markings for alignment are provided at corresponding positions of the surfaces of respective two chips that will be joined to form a chip-on-chip structure and then the markings are employed as markings for achieving an alignment.

Japanese Patent Laid-Open No. 2002-76,247 also discloses a method for establishing an alignment of chips, in which hollow dummy vias having a diameter that are consecutively decreased from the top-arranged chip to the bottom-arranged chip, and the centers of the dummy vias of respective layers are aligned to achieve the alignment of the upper and the lower chips.

SUMMARY OF THE INVENTION

It has now been discovered that these related art documents described above still have a room for an improvement in the following points.

Since an operation of measuring an intensity of transmitted light while conducting an alignment is essential in the method described in Japanese Patent Laid-Open No. H10-303,364, the method requires a light source such as laser, a photodetector for receiving an irradiation light from the light source, and a mounter for mounting the light source and the photodetector. When the diameter of the through hole for alignment is smaller, the intensity of light available to be received at the photodetector is also smaller, thereby disabling the alignment. On the other hand, when the diameter of the through hole is larger, an accuracy of the alignment is worse even though sufficient intensity of light is acquired. Therefore, the optimization of the size of the through hole for transmitting the irradiation light, and the optimization of the light source and the photodetector are required. Moreover, this method additionally requires a dedicated process step for providing through holes for alignment that are capable of transmitting light, in addition to providing a through electrode, and thus the chips of the top layer and the bottom layer of the multi-chip module, which are not necessary to fundamentally have through holes therein, should also have through holes therein.

The method of drawing the markings with the line printer or the laser marker onto the backside of the chip, as described in Japanese Patent Laid-Open No. 2000-228,487, cannot achieve an accurate positioning control at the accuracy level of not finer than 1 μm. Therefore, the method cannot provide sufficient level of the dimensional accuracy in the alignment, and thus the alignment for the fine pitch bonding is impossible in such method. Similarly, the method of drawing the marking onto the backside of the chips corresponding to the positions of the electrodes on the surfaces of the chips, described in Japanese Patent Laid-Open No. 2000-228488, cannot achieve an accurate positioning control at the accuracy level of not finer than 1 μm.

Further, the method described in Japanese Patent Laid-Open No. 2000-228,487 and Japanese Patent Laid-Open No. 2000-228,488 employ an operation of conjugating the upper chip and the lower chip via so-called face down method, which is a method of conjugating the upper and the lower chips while simultaneously image-recognizing the marking for alignment on the lower chip and the backside marking on the upper chip. Therefore, the lower chip is hidden behind the upper chip when chips having an identical size are stacked, such that the marking for alignment cannot be recognized, and thus the application of this method is difficult in such condition.

The method described in Japanese Patent Laid-Open No. 2001-217,387 is a method employed in the ordinary flip chip bonder. This process requires forming the markings for alignment separately at the corresponding equivalent positions on the surfaces of the two chips that are to be conjugated to form the chip-on-chip structure. The method of separately providing the markings for alignment in the separate process steps is difficult to precisely control the correspondence of the markings for alignment on the front surface with that on the back surface in the chip at a level of finer than 1 μm. Therefore, this process is utterly impossible to achieve an improvement in the accuracy of the stack arrangement of 1 µm or finer in the case that chips are stacked to form three or more layers.

The method of employing the hollow dummy vias having continuously reduced diameter, as described in Japanese Patent Laid-Open No. 2002-76,247 can not be expected to provide an improved accuracy in aligning the centers of dummy vias having different diameters to a level of 1 µm or finer, even if the dummy vias are formed with higher accuracy.

In summary, the methods for achieving the alignments in the art can not provide the alignment accuracy at a level of 1 µm or finer, and thus it is impossible to align the chips having finer pitches for bonding. Further, in some cases, extra process steps must be added in order to form the markings for alignment.

According to one aspect of the present invention, there is provided a chip for composing a multi-chip semiconductor device having a plurality of stacked semiconductor chips, comprising: a substrate; and a plurality of electroconductive through plug composed of a conductive material extending through the substrate, wherein the plurality of electroconductive through plug includes a first electroconductive through plug and a second electroconductive through plug being provided separately from the first electroconductive through plug, wherein the first electroconductive through plug and the second electroconductive through plug are configured to be visually distinctive in a plane view, and wherein the second electroconductive through plug is a marking for alignment.

According to another aspect of the present invention, there is provided a chip for a multi-chip semiconductor device, comprising two or more electroconductive through plugs in one chip for the multi-chip semiconductor device, wherein one or more of the electroconductive through plugs are employed as a marking for alignment, and wherein the chip has a configuration of providing an availability of visibly identifying the marking for alignment on a front surface and/or a back surface of the chip for the multi-chip semiconductor device.

In these aspects of the present invention, the term "the second electroconductive through plug being provided separately from the first electroconductive through plug" indicates a configuration of comprising these electroconducting plugs embedded within different through holes, and the term does not include the configuration, in which, for example, a circumference of an electroconductive through plug is surrounded by other electroconductive through plugs and these electroconductive through plugs are provided within one through hole.

Since the first electroconductive through plug and the second electroconductive through plug are configured to be visually distinctive in a plane view in the chip of the present invention, the position of alignment marking can be definitely identified to provide an accurate alignment, when the multi-chip semiconductor device is composed.

Further, the chip for a multi-chip semiconductor device of the present invention includes markings for alignment, which is composed of an electroconductive through plug. Therefore, the markings for alignment can be formed on the front surface and/or the back surface of the chip only with a processing conducted from the surface thereof (such as photolithography, etch and the like).

More specifically, the chip according to these aspects of the present invention may further comprise a configuration, wherein the first electroconductive through plug is provided within a first hole provided in the substrate, and wherein the second electroconductive through plug is provided within a second hole provided in the substrate, the first and the second holes being formed by etching a predetermined region of the substrate off. These aspects of the present invention may further comprise an additional configuration, in which the first electroconductive through plug and the second electroconductive through plug are formed via a same process.

Since the marking for alignment on the chip of the present invention is provided by using one of the electroconductive through plugs, the position and the dimension thereof can be controlled at an accuracy level of, for example, finer than 1 µm. Consequently, if the chip is aligned by using the marking for alignment that has been formed at the formation accuracy level of finer than 1 µm, the chip can be aligned with the alignment accuracy level of finer than 1 µm.

Here, the chip according to the present invention is satisfactory if the chip has the configuration stated above, and the present invention is not intended to be limited to devices including an active element such as a transistor and the like. For example, chips of the present invention may also include a silicon spacer and the like. Here in this specification, the spacer is a plate member for being employed to provide an electrical coupling between each of the stacked chips in the multi-chip semiconductor device, and comprises a substrate such as silicon substrate and the like and a through electrode extending through the substrate. The through electrode is electrically coupled to a conductive member of a semiconductor device provided on an upper portion of the spacer. Further, the spacer may include a configuration of having an element except an active element like a transistor, and may specifically include a passive component of, for example, a interconnect, a capacitor, an inductor, an antenna or the like, or otherwise may include a configuration of being free of the passive component.

These aspects of the present invention may further comprise an additional configuration, in which the first electroconductive through plug couples a first conductive member provided over a surface of the substrate to a second conductive member provided over the other surface of the substrate. The first conductive member and the second conductive member may be provided on the chip, or may be provided on another chip that is coupled to the chip. When these members are provided on another chip, these members may be disposed on the surface facing on the above-described one surface, or the above-described other surface, for example.

Further, in these aspects of the present invention, the second electroconductive through plug may have a configuration of having no coupling to any other conductive member.

These aspects of the present invention may further comprise an additional configuration, in which the second electroconductive through plug has a two-dimensional geometry that is different from the two-dimensional geometry of the first electroconductive through plug.

These aspects of the present invention may further comprise an additional configuration, in which the second electroconductive electroconducting plug can be distinguished from the first electroconductive through plug, on the basis of the two-dimensional arrangement of the second electroconductive electroconducting plug on the chip. For example, the aforementioned second electroconductive through plug may be configured to be disposed at a position closer to the periphery of the substrate than the aforementioned first electroconductive through plug. Further, a plurality of the aforementioned first electroconductive through plugs may be disposed to form a grid-type two-dimensional arrangement thereof, and a plurality of aforementioned second electroconductive through plug may be arranged at a predetermined interval in a side adjacent to a region where the aforementioned first electroconductive through plug is disposed.

According to another aspect of the present invention, there is provided a chip bonding apparatus for a multi-chip semiconductor device, wherein, when the chip for the multi-chip semiconductor device comprising two or more electroconductive through plugs in one chip for a multi-chip semiconductor device and further comprising one or more of the electroconductive through plugs employed for marking for alignment is stacked by the bonding apparatus, a position of the chip of the multi-chip semiconductor device is calculated by utilizing the marking for alignment.

According to the bonding apparatus for the chip for the multi-chip semiconductor device of the present invention, the alignment accuracy can be improved when the chip for the multi-chip semiconductor device and the other chip are stacked by employing the bonding apparatus. For example, the bonding can be conducted at an alignment accuracy level of finer than 1 µm.

According to further aspect of the present invention, there is provided a method for aligning a chip for a multi-chip semiconductor device, wherein, when the chip for the multi-chip semiconductor device having two or more electroconductive through plugs in one chip for the multi-chip semiconductor device and including one or more of the electroconductive through plugs employed for marking for alignment is aligned and then stacked, the chip for the multi-chip semiconductor device is aligned by utilizing the marking for alignment.

According to the method for aligning the chip for the multi-chip semiconductor device of the present invention, the accuracy of the alignment of the chip can be improved, since the marking for alignment composed of an electroconductive through plug is employed when the chip for the multi-chip semiconductor device is aligned and then stacked. For example, the chip can be aligned with the alignment accuracy level of finer than 1 µm.

According to further aspect of the present invention, there is provided a method for manufacturing a chip for a multi-chip semiconductor device, comprising: etching a chip for a multi-chip semiconductor device to form two or more vias; filling the two or more vias formed in the etching the chip to form the two or more vias with an electroconductive material; and exposing the electroconductive material by retreating a back surface of the chip for multi-chip semiconductor device having the electroconductive material filled therein during the filling the two or more vias with the electroconductive material; wherein one or more of the electroconductive through plug having the electroconductive material filled therein is employed as a marking for alignment, and wherein the marking for alignment and other one of the electroconductive through plugs are configured to be visually distinctive on a front surface and/or a back surface of the chip for the multi-chip semiconductor device.

According to the method for manufacturing the chip for the multi-chip semiconductor device of the present invention, the marking for alignment and the electroconductive through plug are manufactured in one process. Further, the chip having a configuration of comprising the marking for alignment and other electroconductive through plugs, which are visually distinctive on a front surface and/or a back surface of the chip, can be obtained. Thus, the chip providing improved accuracy for the alignment can be stably manufactured by a simple process. For example, if the chip is aligned using such marking for alignment, the chip can be aligned at the alignment accuracy level of finer than 1 µm.

In the present invention, in order to identify the aforementioned marking for alignment on the front surface and/or the back surface of the aforementioned chip for the multi-chip semiconductor device, some change in the arrangement and the geometry thereof may be added. For example, the shape of the marking for alignment may be a circle, an L shape and a dot or a cross to provide the identification thereof. Further, the identification can also be provided by changing the size of the marking for alignment with the size of other electroconductive plug.

Further, the identification can also be provided by the relative positioning of the marking for alignment with the electroconductive plug. For example, the identification can be provided by employing a specific column of the electroconductive plugs as the marking for alignment or by adding a short column of the marking for alignment to the column of the electroconductive plug. Alternatively, some of the electroconductive through plugs can be deviated from the regular arrangement to form the recognizable pattern of the marking for alignment.

Further, in the present invention, the aforementioned marking for alignment can be provided on the front surface and the back surface of the through plug employed for the electroconductive marking for alignment as having an identical geometry. More specifically, the marking having the same shape may desirably be provided on both of the front surface and the back surface of the chip, and the shape can be selected from arbitrary shapes such as circle, L shape, cross, dot or the like. Having such configuration, marking for alignment having the same shape can be identified on both of the front surface and the back surface of the chip, thereby preventing the false mountings of the chip. In the present invention, the front surface of the chip may be utilized as the element formed surface.

In the present invention, the markings for alignment may have an asymmetric geometry or an asymmetric arrangement thereof. Specific configuration thereof may be, for example, that the two-dimensional geometry of the aforementioned markings for alignment or the arrangement thereof on the surface of the chip is asymmetric against the center of the chip surface. Having such configuration, the front surface of chip can be distinguished from the back surface thereof. Since the electroconductive through plug related to the electric conduction is symmetrically arranged in general, the front and the back surfaces are difficult to be distinguished from the appearance thereof, when a spacer having through electrodes and also having only passive elements mounted thereon, such as an interconnect, an inductor, a capacitance, a resistance and the like is formed. In such case, if the configuration for providing a distinction of the front surface of chip from the back surface thereof by the marking for alignment is provided, the false mountings of the chip can be prevented, thereby leading to the improvements in the junction reliability.

In the present invention, the electroconductive through plug employed for the marking for alignment may have cross-sections, a minimum width of which is equal to or less than a minimum width of other electroconductive through plug, and the minimum width thereof may be equal to or less than 1 µm. Generally, the condition for the filling the through plug varies depending on the width thereof, and the above-described condition allows the formation of the marking for alignment simultaneously with other electroconductive through plugs via the same process under the same condition. Consequently, load to the manufacturing process can be reduced. In addition, when the diameter of marking for alignment is smaller than the diameter of other electroconductive through plugs, the area of the chip utilized in the actual operation can be broadened.

In the present invention, the front surface and/or the back surface of the electroconductive through plug employed for the marking for alignment may be covered with an insulating material.

In addition, in the present invention, the method may further comprises forming an insulating film on one or more front surface and/or back surface of the electroconductive through plug having the electroconductive material filled therein, after the filling two or more vias with the electroconductive material.

The plug is coated with the insulating material to prevent an adhesion of the metal plating interconnect and bump onto the marking for alignment. Consequently, the form accuracy thereof in overlooking the marking for alignment from the perspective viewpoint can be maintained at the level of the resolution in the photolithography, and thus the deterioration of the alignment accuracy can more definitely be inhibited.

The insulating materials may typically include transparent materials such as, for example, $SiO_2$, SiON, SiN and the like. In addition, the available material is not necessary to be limited to the transparent material, and the colored materials may also be employed. Having such configuration, the marking for alignment can be electrically insulated, and thus the hazards such as short-circuit can be prevented. In addition, if the colored materials are employed, the electroconductive plug can be more easily identified from other electroconductive plug, as it is colored.

In the present invention, the aforementioned marking for alignment may be an alignment marking for the packaging, or may be positioning marking for photolithography. In the case of positioning marking for photolithography, a minimum width thereof may be equal to or less than a minimum width of other electroconductive through plug, and the minimum width thereof may be equal to or less than 1 μm.

Further, the electric potential of at least a portion of the electroconductive through plug employed for the marking for alignment may be fixed.

Noise emitted from the chip during the operation of the multi-chip semiconductor device can be reduced by fixing at least a portion of an electric potential of the electroconductive through plug employed as the marking for alignment, and thus the multi-chip semiconductor device having higher reliability can be presented.

Moreover, the diameter of the vias can be considerably reduced by utilizing the dry etching in the aforementioned process of etching the vias in the method for manufacturing the chip according to the present invention, as compared with the case of forming a through hole by other procedures such as laser processing or drilling that present the through hole having a diameter of at least several tens μm. Thus, the chip having further improved aligning accuracy can be stably manufactured via the simple and easy process.

In the present invention, the method for filling the aforementioned vias with the electroconductive material may be one or more selected from a group consisting of: plating; sputtering; CVD; conductive resin application; and melting of solder/low melting-point metals.

BRIEF DESCRIPTION OF THE DRAWINGS

The above and other objects, advantages and features of the present invention will be more apparent from the following description taken in conjunction with the accompanying drawings, in which:

FIGS. 4A to 4G are plan views of the chip for the multi-chip semiconductor device of a third embodiment of the present invention, illustrating a configuration of the chip;

DETAILED DESCRIPTION OF THE PREFERRED EMBODIMENT

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments according to the present invention will be described as follows in further detail, in reference to the annexed figures. In all figures, identical numeral is assigned to an element commonly appeared in figures, and the detailed description thereof is not presented. In the following embodiments, cases of chips comprising silicon substrate will be described.

First Embodiment

Figure 2A:
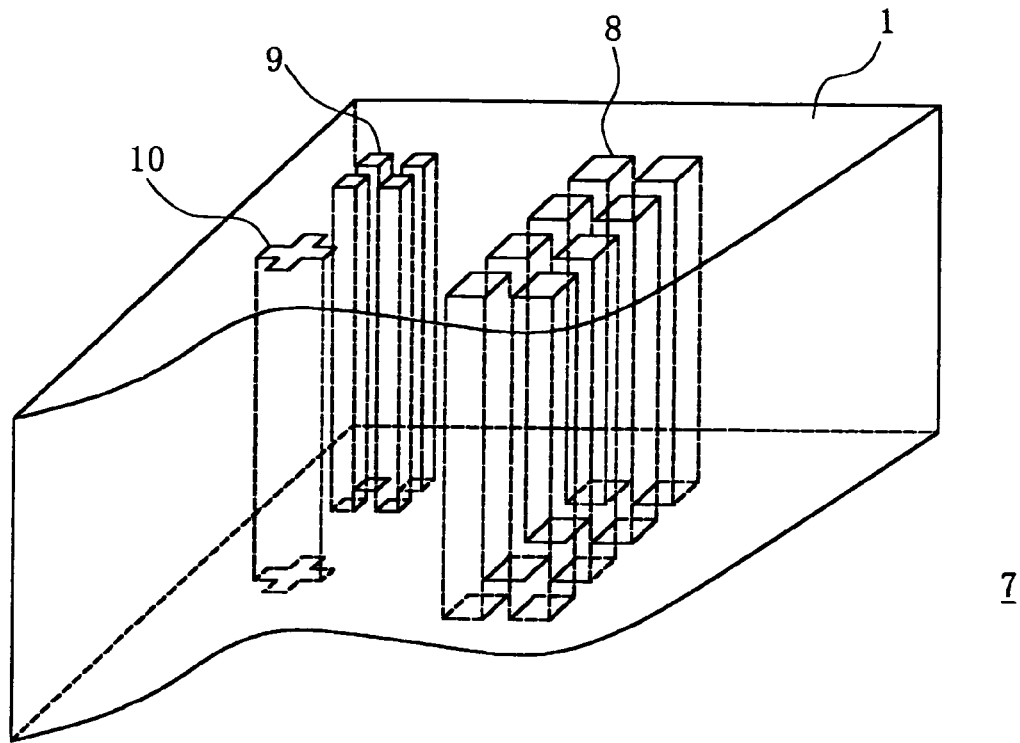
FIG. 2A and FIG. 2B are perspective views of the chip for a multi-chip semiconductor device of the first embodiment of the present invention, illustrating a configuration of the chip.
Figure 2B:
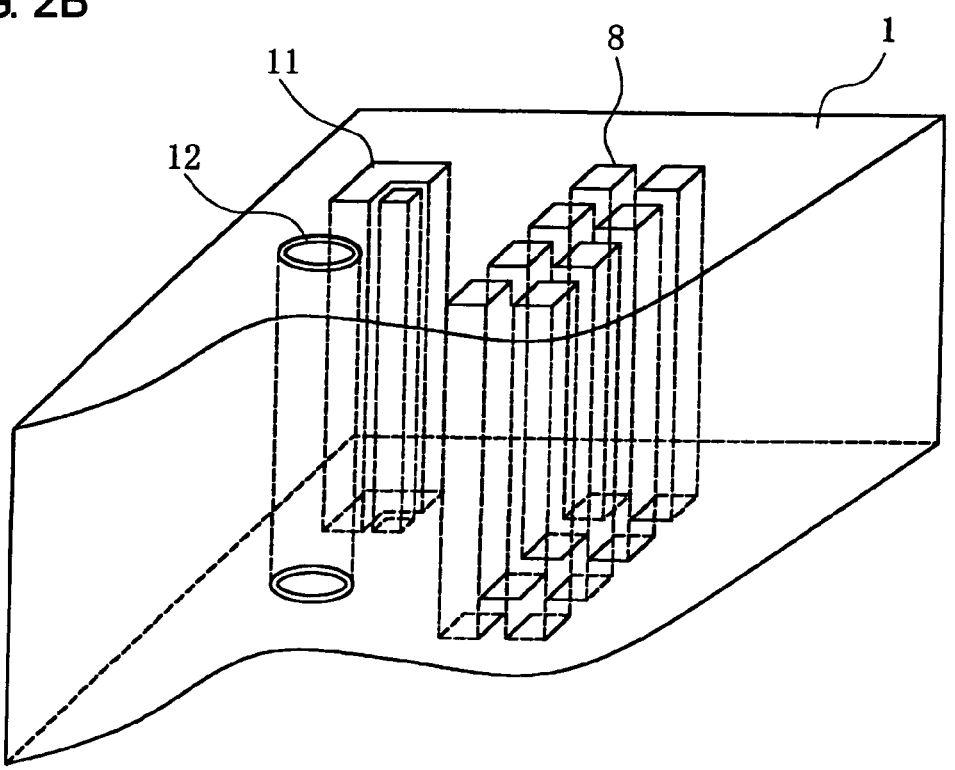

FIG. 2A and FIG. 2B are perspective views, illustrating a configuration of a chip for a multi-chip semiconductor device of the present embodiment. A chip 7 for a multi-chip semiconductor device shown in FIG. 2A and FIG. 2B is a chip composing the multi-chip semiconductor device, which includes a plurality of stacked semiconductor chips, and comprises a substrate 1 (silicon substrate), and a plurality of electroconductive through plugs that are composed of a conductive material passing through the substrate 1 (electroconductive through plugs 8 and markings for alignment 9 to 12).

These multiple electroconductive through plugs comprise first electroconductive through plugs (electroconductive through plugs 8) and second electroconductive through plugs that are provided separately from the electroconductive through plugs 8 (markings for alignment 9 to 12). The markings for alignment 9 to 12 and the electroconductive through plugs 8 are configured to be visually distinctive in a plane view.

The electroconductive through plugs 8 function as though electrodes, which electrically couple a first conductive member provided in one side of the substrate 1 (not shown) to a second conductive member provided in the other side of the substrate 1 (not shown). In addition, the second electroconductive through plugs are markings for alignment. The markings for alignment 9 to 12 may be configured to have no coupling to other conductive members provided by either surfaces of the substrate 1.

FIG. 2A is a perspective view, illustrating a case of employing markings for alignment 9, a combination of which creates a cross-section of a white space-crisscross on a colored background, and a marking for alignment 10 having a cross-section of a crisscross. In this specification, the term "a combination creates a cross-section of a white space-crisscross on a colored background" means that four electroconductive through plugs composing the marking for alignment create a cross-section of a crisscross when the four electroconductive through plugs have a color, which is different from that of the circumference portions. For example, when the color of the ground of the chip is white and the color of the electroconductive through plugs composing the marking for alignment is black, the marking for alignment can be recognized as the crisscross of white space on the black background.

FIG. 2B a perspective view, illustrates a marking for alignment 11 having a cross-section of an L shape and a dot and a marking for alignment 12 having a circular cross-section.

The markings for alignment 9 to 12 described above have, as shown in FIG. 2A and FIG. 2B, the shape on the front surface of the chip that is same as the shape thereof on the back surface, and thus the marking for alignment 9 to 12 can be completely identified with other electroconductive through plugs 8.

While FIG. 2B illustrates the case of employing the hollow cylindrical marking for alignment 12 having the circular cross-section, a solid cylindrical marking for alignment 12 may also be employed.

FIG. 1A to FIG. 1D are cross-sectional views, illustrating a manufacturing process of a chip for a multi-chip semiconductor device. Although the case of providing through plugs functioning as markings for alignment at both ends will be described here with a cross-sectional view point, the method that will be described in reference to FIG. 1A to FIG. 1D may also be applicable to the chip for the multi-chip semiconductor device shown in the FIG. 2A and FIG. 2B described above and to the chip for the multi-chip semiconductor device in other embodiments described later.

A critical point is that the marking for alignment can also be simultaneously formed by the process for forming other electroconductive through plugs provided in the chip such as a plug having a facility of providing the electrical coupling between the chips.

Figure 1A:
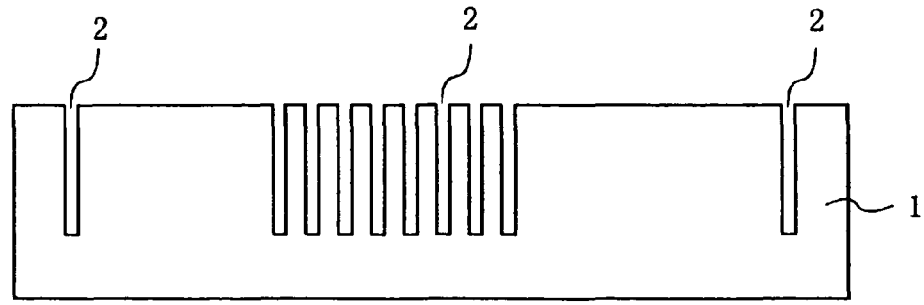
FIGS. 1A to 1D are cross-sectional views of a substrate, illustrating a manufacturing process of a chip for a multi-chip semiconductor device according to a first embodiment of the present invention.

First, as shown in FIG. 1A, a through hole pattern of an electroconductive through plug is exposed to light by a photolithography process for a surface of a substrate 1. Then, predetermined positions on the substrate 1 are selectively removed by a dry etching to form vias 2 for forming through holes. A plurality of via 2 is provided. Electroconductive through plugs 8 having functions as though electrodes are provided that are embedded within some of vias 2, and electroconductive through plugs functioning as markings for alignment 9 to 12 are provided that are embedded within the other vias 2.

Figure 1B:
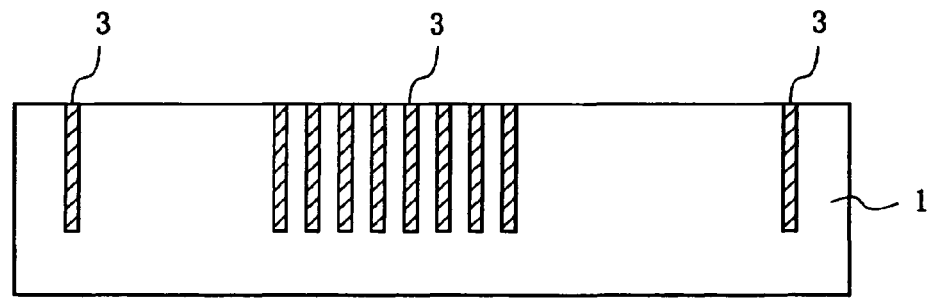

Then, as shown in FIG. 1B, deep vias 2 manufactured in FIG. 1A are coated with an insulating film (not appeared in the figure), and a seed layer (not appeared in the figure) is formed by a sputter, and then the vias 2 are filled with a electroconductive material 3 by an electrolytic plating. In this case, the metal for filling may be appropriately selected from Cu, Al, Au, W, Ti, Sn, solder or the like. Alternatively, an electrically conductive resin may be employed for filling within the via 2.

Figure 1C:
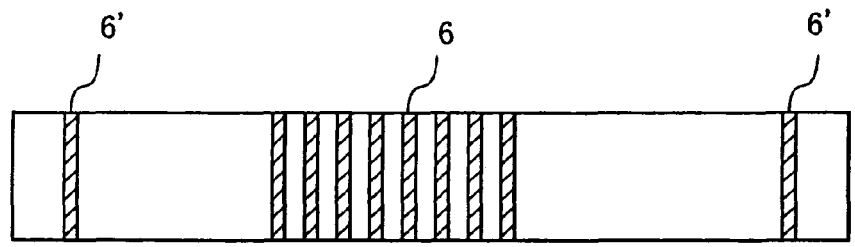

Subsequently, as shown in FIG. 1C, after grinding the back surface of the substrate 1, a dry etching, a dry polishing or a wet etching is conducted to expose the metals, which have filled within the through holes, onto the back surface thereof, thereby completing the electroconductive through plugs 6. The electroconductive through plugs 6 and 6' correspond to the electroconductive through plugs 8 in FIG. 2A and FIG. 2B.

Although a bump metal plating may be adhered to the electroconductive through plugs 6' employed as the markings for alignment, an insulating film may alternatively be applied, and when the electroconductive through plugs 6' are coated with the insulating film, the form accuracy of the plug can be further improved, and thus higher accuracy in the photolithography can be further maintained.

Figure 1D:
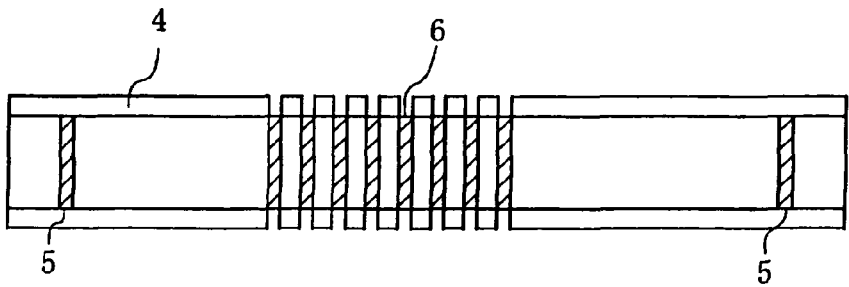

Then, as shown in FIG. 1D, the upper surfaces and/or the back surfaces of the through holes for forming the markings for alignment are covered with a covering insulating film 4 (insulating films: $SiO_2$, SiON, SiN or the like) to provide complete forms of the markings 5 for alignment. In this configuration, covering the markings for alignment 5 with the cover insulating film 4 is not an essential matter, and when the markings are covered with the insulating film 4, the adhesion of the plating metal to the region covered with the cover insulating film 4 is avoided even if the formation process of forming the bump plating is started, and thus the advantageous effect of maintaining the form accuracy thereof in overlooking thereof from the perspective viewpoint at the level of the resolution in the photolithography process.

The chip for the multi-chip semiconductor device can be obtained as described above.

Since the ordinary electroconductive through plug 6 should be equipped with a bump plating, the region of the cover insulating film 4 above or under the electroconductive through plug 6 is provided with openings.

Next, advantageous effects obtainable by employing the chip for the multi-chip semiconductor device according to the present embodiment will be described.

The alignment markings, which can be easily identified from other through plugs, are provided at predetermined positions within the surface of the chip 7 for the multi-chip semiconductor device shown in FIG. 2A or FIG. 2B.

The alignment markings are formed of the same material and by same process as that for forming other electroconductive through plugs in the chips. Thus, no unwanted process for forming the alignment marking is additionally required, thereby providing a simple and easy manufacturing process. For example, it is not necessary to conduct an additional process for forming a marking for alignment such as, for example, a process for conducting a photolithography for the back surface of the chip or a process for forming the through hole for forming the alignment marking with a laser beam.

In addition, since the apertures for forming markings for alignment 9 to 12 embedded therein are formed via the etching, the diameter of the marking for alignment can be reduced in comparison with the case of forming the through holes for the alignment markings via the laser beam. Having a configuration of utilizing such alignment markings for markers of the positioning, the accuracy in aligning thereof in the direction of the stack can be improved in the case of stacking a plurality of chips. Thus, the configuration of providing improved stability and reliability in the manufacturing process for the multi-chip semiconductor device can be presented.

For example, when the bonding in the form of the flip chip or the chip-on-chip is formed, the alignment of the chips can be conducted at an accuracy level of finer than 1 μm. In addition, since the alignment of the chips can be conducted at an accuracy of finer than 1 μm, the process can also be applied to the aligning of the chip having finer bonding pitches.

Since the alignment markings extend through the chip in the chip 7 for the multi-chip semiconductor device shown in FIG. 2A or FIG. 2B, alignment markings can be disposed at the same position in both sides of the chip.

In the case of a chip having alignment markings only on the front surface of the chip, the aligning accuracy on the back surface of the chip employed as the medium layer of the multi-chip semiconductor device may be deteriorated in comparison with the aligning accuracy on the front surface thereof. On the contrary, having the configuration of the present embodiment, the alignment accuracies of a chip disposed on one side of the medium layer chip and a chip disposed on the other side of the medium layer chip can be definitely improved, respectively. In addition, it is not necessary to prepare a chip including markings for alignment having different geometries and dimensions, and thus the markings for alignment can be produced in one straight procedure.

In addition, the method for providing the conjunction of the chips are not limited, and thus any method for providing the conjunction of the chips such as, for example, facing down, imaging from upper and lower directions, infrared ray-transmitting imaging or the like, can be employed.

In addition, the smaller alignment marking can be employed in comparison with the case of the alignment of the light-transmission type, and further smaller diameter of the through hole can be presented by using the dry etching process, and thus the actually utilized area of the chip can be comparatively broader.

While the case of utilizing the same two-dimensional geometry of the alignment marking on both sides of the chip is illustrated in the present embodiment, the two-dimensional geometry of the electroconductive through plug functioning as the alignment marking is not necessary to have same geometry and dimension on both sides of the chip, and the alignment marking of truncated cone shape having an increasing cross-section from one side to the other side of the chip may also be provided. Having the configuration of providing the same two-dimensional geometry on both sides of the chip, a misalignment occurred when the chips are stacked can more definitely be inhibited to provide a further improvement in the alignment accuracy.

Further, having the configuration of providing the asymmetrically arranged markings as the markings for alignment, the operations such as the distinction of the front surface from the back surface of the chip or the determination of the rotating angle can more easily be conducted.

Second Embodiment

Figure 3:
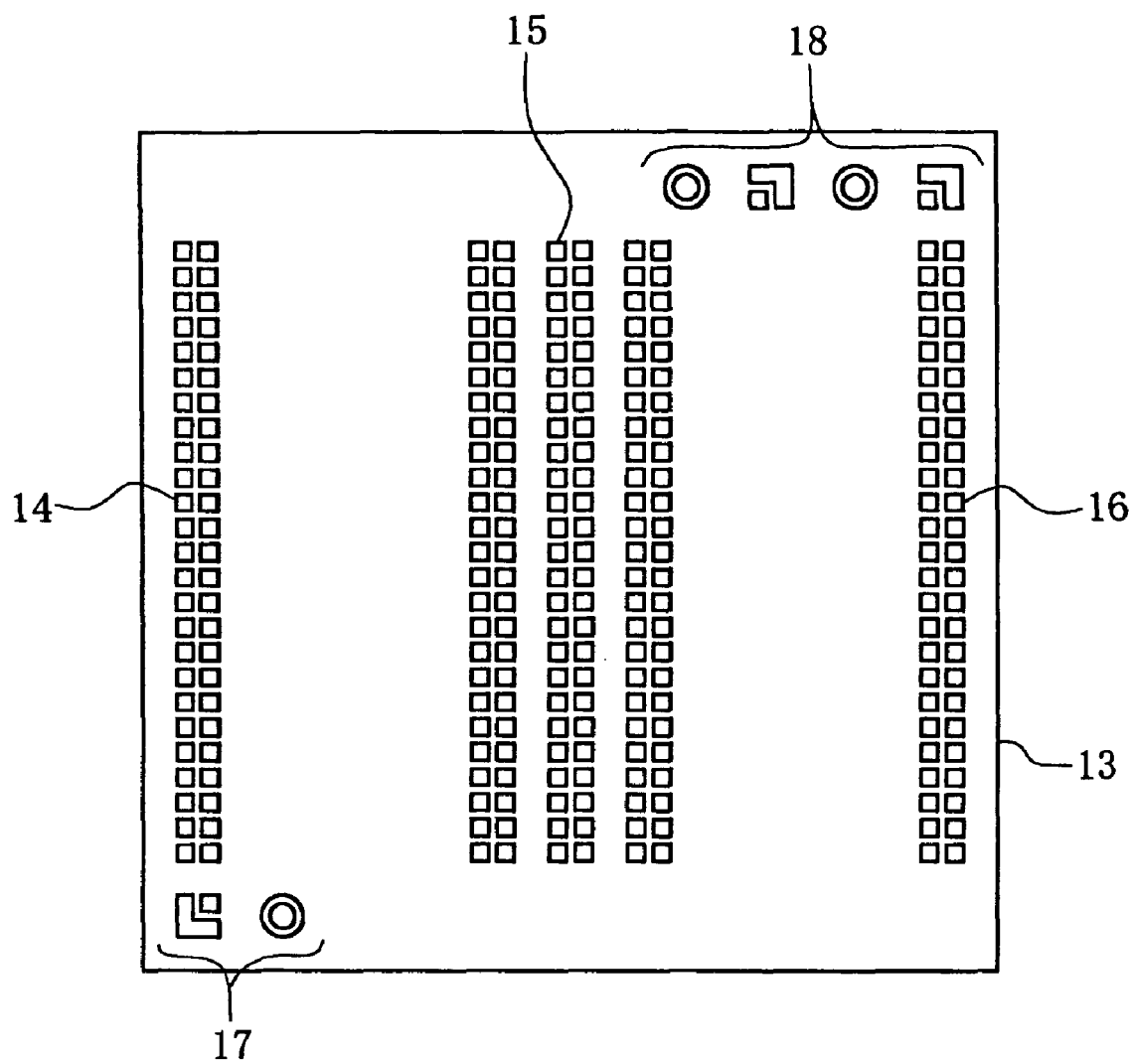
FIG. 3 is a plan view of the chip for the multi-chip semiconductor device of a second embodiment of the present invention, illustrating a configuration of the chip.

FIG. 3 is a plan view, illustrating a configuration of a chip for a multi-chip semiconductor device of the present embodiment. A chip for a multi-chip semiconductor device (chip 13) shown in FIG. 3 comprises electroconductive through plugs 14 to 16, markings for alignment 17 and markings for alignment 18. The chip 13 can be manufactured by using, for example, a method for manufacturing the chip for the multi-chip semiconductor device described in the first embodiment.

In FIG. 3, a two-dimensional geometry of the chip 13 is a rectangular (square in this embodiment).

The marking for alignment 17 appeared in the lower portion in FIG. 3 and the marking for alignment 18 appeared in the upper portion thereof are illustrated to be asymmetrically arranged within the surface of the chip 13 (in the upper and the lower portions in the figure). More specifically, a configuration is provided, in which the lower markings for alignment 17 and the upper marking for alignment 18 are composed of basic units consisting of an alignment marking 11 of an L shape and a dot and a circular alignment markings 12 shown in FIG. 2B and arranged side by side in vicinity of a periphery of the chip, and the numbers of the repetition of the base units are different by the opposing edges, and thus the arrangement of the alignment markings are asymmetric over the center of the chip surface. Since the identification of the edge of the chip is possible by utilizing the number of the repetition of the base units, the arranging direction of the chip can easily be identified.

The identification of the front and the back surfaces of the chip 13 and the determination of the rotating angle in the surface direction can easily be conducted by asymmetrically arranging the markings for alignment in vicinity of a plurality of edges of the rectangular chip in the present embodiment. It would be needless to point out that the markings for alignment 17 and the markings for alignment 18 have different two-dimensional geometries from that of the other electroconductive through plugs 14 to 16, and thus can be identified from these plugs.

Further, the alignment markings, which can easily be identified from other through plugs, are stably formed with higher accuracy at predetermined positions on the surface of the chip 13 in the present embodiment. Moreover, no unwanted procedure for forming the alignment markings is additionally required. Thus, the present embodiment provides the configuration of enabling to form the alignment markings, which promote higher alignment accuracy by a simple process, similarly as in the first embodiment.

Here, concerning the lower marking for alignment 17 and the upper marking for upper alignment 18 in the present embodiment, the configuration of providing the identification of the positions of the alignment markings within the surface may be presented by having different two-dimensional geometries or dimensions for the markings for alignment.

Third Embodiment

In the third embodiment, a configuration of providing an identification of the marking for alignment is presented by utilizing the relative position of an electroconductive through plug functioning as a marking for alignment against an electroconductive through plug functioning as a though electrode within the surface of a substrate.

FIGS. 4A to 4G are plan views, illustrating a configuration of a chip for a multi-chip semiconductor device of the present embodiment. In FIGS. 4A to 4G, electroconductive through plugs and alignment markings are shown, and the substrate is not shown. A chip for a multi-chip semiconductor device shown in FIGS. 4A to 4G can be manufactured by, for example, using any of the aforementioned methods for manufacturing the chip for the multi-chip semiconductor device.

FIG. 4A to FIG. 4D illustrate examples of providing identifications by forming alignment markings having a two-dimensional geometry same as that of electroconductive through plugs, and utilizing the relative relationship between the positions for disposing the electroconductive through plugs and the positions for disposing the alignment markings. In FIG. 4A to FIG. 4D, electroconductive through plugs 19, 21, 23 or 25 are arranged to form a square lattice within the substrate surface. Then, some of these plugs are dislocated from the regular arrangement to form patterns 20, 22 and 24 of the markings for alignment that can be identified.

More specifically, defective portions are provided in the lattice arrangements of the electroconductive through plug 19 and the electroconductive through plug 21 in FIG. 4A and FIG. 4B, respectively, and the plugs adjacent to the defective portions are utilized as markings for alignment 20 and marking for alignment 22, respectively.

In FIG. 4C and FIG. 4D, a group of the markings for alignment 24 and a group of the markings for alignment 26 are disposed in the sides of a group of the lattice-disposed electroconductive through plugs 23 and a group of the lattice-disposed electroconductive through plugs 25, respectively, and the plug in the groups 24 and 26 has the same geometry as the plug in the groups 23 and 25, and the numbers of the plugs in the groups 24 and 26 are less than that of the groups 23 and 25, respectively.

FIG. 4E to FIG. 4G illustrate examples of forming markings for alignment 28, 30 and 32 having different geometries from the electroconductive through plug in the side within the substrate surface of the electroconductive through plugs 27, 29 and 31 that are arranged in the square-lattice forms (in the lower portion of the figure), respectively. While the cross-section of the electroconductive through plugs 27, 29 and 31 are square, the cross-section of the marking for alignment 28, 30 and 32 are rectangular.

As such, the distinction of the front and the back surfaces of the chip or the determination of the rotating angle can easily be conducted by disposing the electroconductive through plugs and the markings for alignment. Thus, similarly as in the first and the second embodiments, no unwanted process for forming the alignment marking is additionally required, and the alignment marking having improved aligning accuracy can be stably manufactured via the simple and easy method in the present embodiment.

In the first, the second and the third embodiments described above, the electroconductive through plug for the marking for alignment may have a minimum width of a cross-section thereof of equal to or less than a minimum width of other electroconductive through plugs. As an example of such configuration, a two-dimensional configuration shown in FIG. 4F illustrated in this section of the third embodiment may be presented.

Generally, the condition for the filling the electroconductive through plug varies depending on the width thereof, and the above-described condition allows the formation of the marking for alignment simultaneously with other electroconductive through plugs via the same process under the same condition. Consequently, load to the manufacturing process can be reduced.

While the present embodiment describes the case of employing the marking for alignment to provide the aligning between the chips, the marking can be utilized as the alignment marking in the lithography process for forming an interconnect that provides a mutual coupling of bump platings formed on the electroconductive through plug. When the marking for alignment is used as the positioning marking for the photolithography process, the minimum width thereof can be equal to or less than a minimum width of other electroconductive through plug, and the minimum width thereof is equal to or less than 1 μm, in consideration of the positioning accuracy. Having such configuration, further improvement in the alignment accuracy can be presented.

Fourth Embodiment

In the fourth embodiment, a method for stacking chips for a multi-chip semiconductor device described in the above-mentioned embodiments and an example of a bonding apparatus employed in this buildup will be described.

Figure 5:
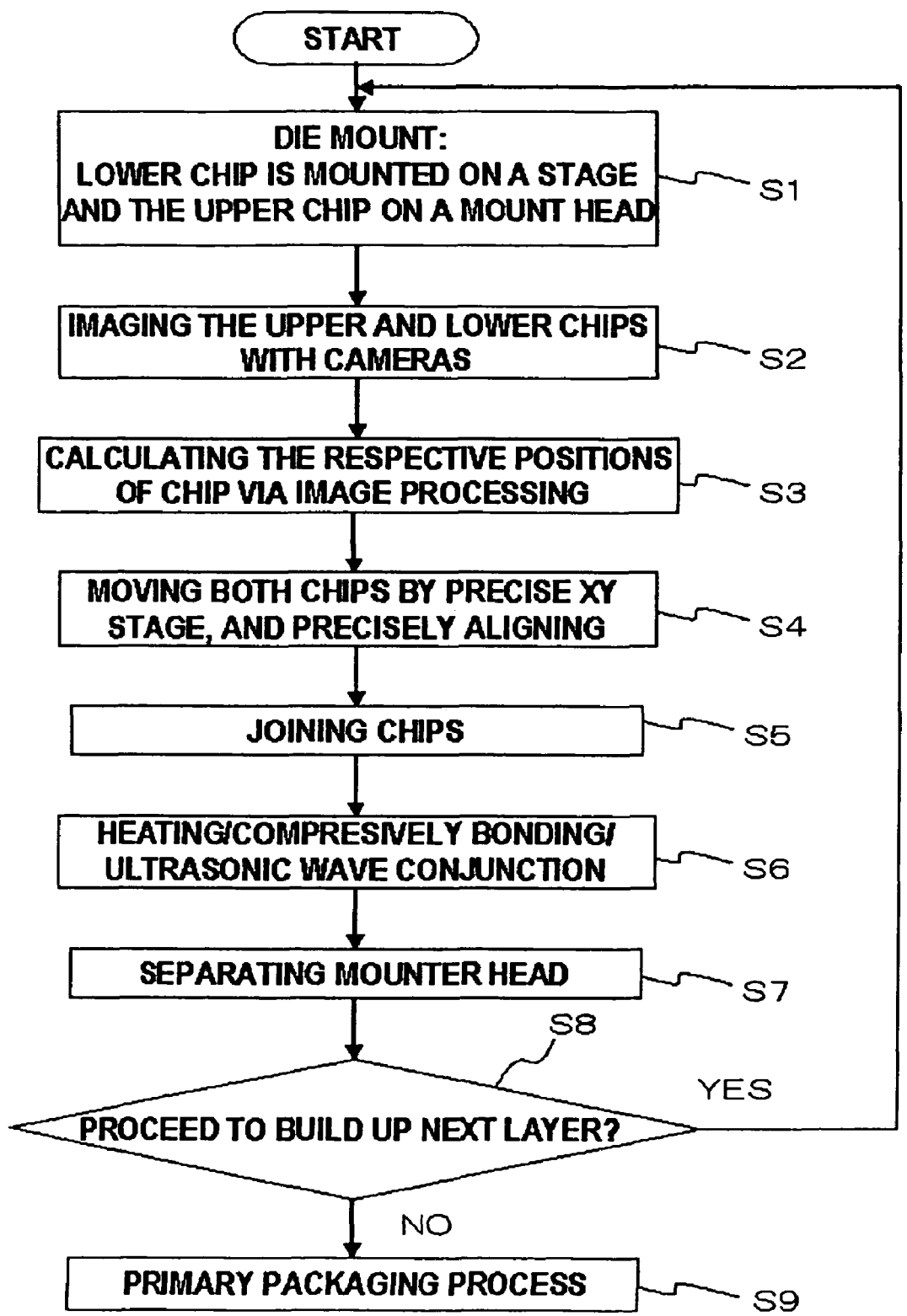
FIG. 5 is a flow chart, illustrating a method for stacking the chips for the multi-chip semiconductor device by using the bonding apparatus for the chips of a fourth embodiment of the present invention.
Figure 6A:
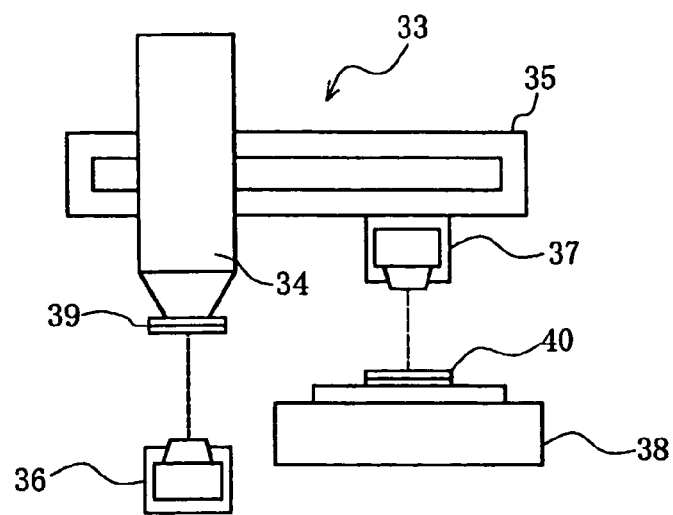
FIGS. 6A, 6B and 6C are schematic cross-sectional views of the bonding apparatus for stacking the chips for the multi-chip semiconductor device of the fourth embodiment of the present invention, showing a configuration of the bonding apparatus.
Figure 6B:
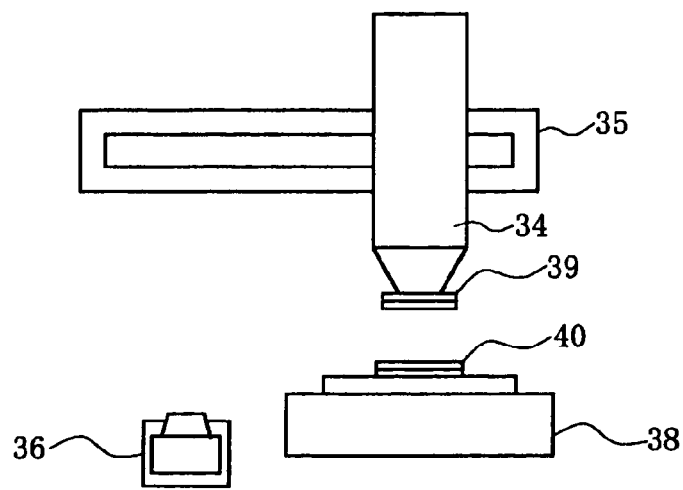
Figure 6C:
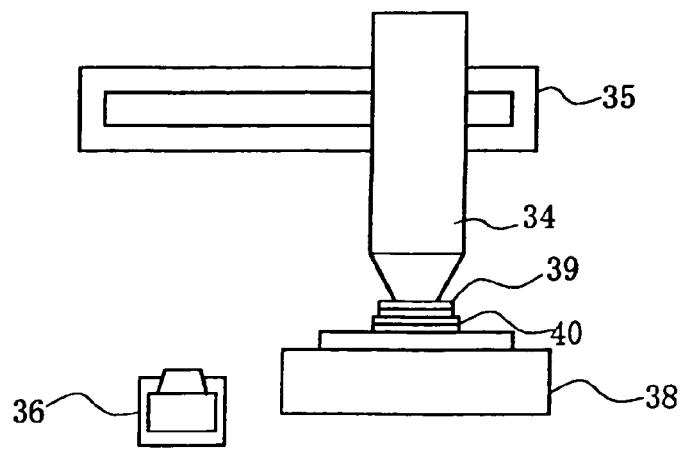

FIG. 5 is a flow chart, illustrating a method for stacking the chips for the multi-chip semiconductor device by using a bonding apparatus for the chips according to the present embodiment. FIGS. 6A, 6B and 6C are schematic cross-sectional views, showing a configuration of the bonding apparatus for stacking the chips for the multi-chip semiconductor device.

A bonding apparatus 33 shown in FIGS. 6A, 6B and 6C comprises a mount head 34, a mounter 35, a camera 36, a camera 37, and a stage 38. An upper chip 39 is maintained in the mount head 34 connected to the mounter 35. The stage 38 sustains the lower chip 40. The camera 36 and the camera 37 are provided so as to image a lower surface of the upper chip 39 and an upper surface of the lower chip 40, respectively.

The procedure for stacking the chips will be described in reference to FIG. 5, FIGS. 6A, 6B and 6C by illustrating the case of mounting the upper chip 39 onto a predetermined position on the lower chip 40 as shown in FIGS. 6A, 6B and 6C in the procedure described in FIG. 5.

(1) Die Mount

The upper chip 39 and the lower chip 40 are diced, and the diced lower chip 40 is mounted on a stage 38 and the diced upper chip 39 is amounted on a mount head 34 of a bonding apparatus 33 (S1). In this occasion, at least either one of the upper chip 39 and the lower chip 40 is the chip illustrated in the above-mentioned embodiments, and it is assumed that the chip comprises electroconductive through plugs and the markings for alignment of the back surface are visible.

(2) Imaging the Marking for Alignment

The upper surface of the lower chip 40 is picked-up from the upper direction, and the lower surface of the upper chip 39 is picked-up from the lower direction by the cameras 36 and 37, respectively (S2). The types of the available cameras are not particularly limited, provided that the image processing described below can be conducted.

(3) Image Processing

An image processing of a portion of the chip including the marking for alignment is conducted over at least two places on one chip to obtain the center position in the plane of the chip (S3). FIG. 6A shows the condition when the process of determining the coordinate (center position) of the chip is finished.

(4) Movement

The XY axis of the mounter head 34 or the stage 38 are precisely moved to precisely coincide the positions of the chips 39 and 40 (S4). FIG. 6B illustrates the condition of the chip moved to a location for providing a conjunction.

(5) Conjunction

The mounter head 34 is vertically lowered to join the upper chip 39 to the lower chip 40 (S5). In this case, it is configured to have a capability of precisely controlling the load applied to the bump.

FIG. 6C shows the condition of providing such conjunction.

(6) Heating/Compressively Bonding/Ultrasonic Wave Conjunction

The bump is adhered between the chips, by using an optimal method that depends upon the type of the employed bump and the configuration of the mounter (S6).

(7) Mounter Head Separation

The mounter head 34 is lifted up to separate therefrom, though it is not shown in FIG. 6A, 6B or 6C (S7). Thereafter, if the stack of the chips is further continued ("Yes" in S8), it returns to the step 1, and the buildup of chips corresponding to a third or more layer are conducted. If the stack of the chips is finished ("No" in S8), the procedure is progressed to a primary packaging process such as packaging a module (mounting on an interposer) and the like (S9).

In the above-mentioned procedure, when one of the chips mounted thereon is a chip except the chip described in the first to third embodiments, the comprehension of the position of the chip in step 3 may be conducted by, for example, recognizing a predetermined interconnect structure formed on the chip.

In the present embodiment, the accuracy in aligning thereof can be improved in the case of stacking a plurality of chips by employing the chip described in the above-mentioned embodiments.

Since the active surface (surface, on which an element is formed) on the chip is opposed to the active surface of another chip in the conventional structure, the stack is limited to form dual layers. On the other hand, the buildup process to form triple layers or more becomes possible by employing the method according to the present embodiment.

For example, in consideration of the device having the electroconductive through plug as the upper chip 39, the method for providing the chip-on-chip bonding cannot be used as it is in the case of having the marking for alignment only on the front surface of the chip, or in case of utilizing the hole or the transparent through hole as the marking for alignment, and the mounter having a non-standard configuration is necessary in these cases, such as that having a transparent aperture for transmitting light therethrough in the head portion.

However, on the other hand, according to the method for bonding the chips for the multi-chip semiconductor device of the present embodiment, the aligning of the both sides of the chip can be precisely conducted, since the markings for alignment composed of electroconductive through plugs are provided on the front surface and the back surface of the chip. Therefore, the multi-chip semiconductor device having a multilayered body can be obtained by repeating the same process for forming the chip-on-chip dual layers. This advantageous effect is considerably exhibited if the opposed surfaces of the chips to be stacked are picked-up by different cameras 36 and 37, respectively.

Fifth Embodiment

In the fifth embodiment, the description will be made on a multi-chip semiconductor device, which can be obtained by stacking chips for a multi-chip semiconductor device using a bonding apparatus described in the above-mentioned embodiments. In the chip composing the multi-chip semiconductor device of the present embodiment, the configuration of the marking for alignment is assumed to be the configuration illustrated in the above-described embodiments.

Figure 7:
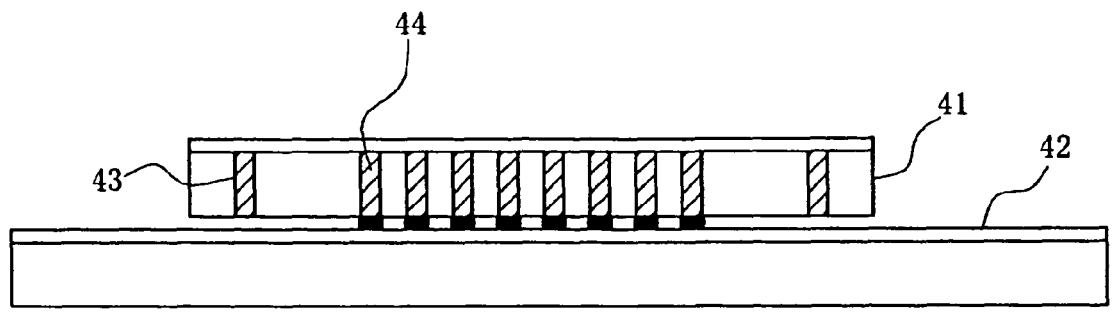
FIG. 7 is a schematic cross-sectional view of the semiconductor device formed by conducting the buildup process with the bonding apparatus for the chip for the multi-chip semiconductor device shown in FIGS. 6A to 6C.

FIG. 7 is a schematic cross-sectional view of a multi-chip semiconductor device, formed by stacking the two chips for the multi-chip semiconductor device 41 and 42.

In FIG. 7, markings for alignment 43 and electroconductive through plugs 44 are provided in the chip for the multi-chip semiconductor device 41. The chip for the multi-chip semiconductor device 42 has an area of the chip surface that is larger than that of the chip for the multi-chip semiconductor device 41, and the chip for the multi-chip semiconductor device 42 is bump-coupled onto the chip for the multi-chip semiconductor device 41.

The markings for alignment 43 are employed to provide an alignment of the chip for the multi-chip semiconductor device 41 and the chip for the multi-chip semiconductor device 42 within the chip surface at an accuracy of finer than 1 μm and then these aligned chips are bonded to obtain a multi-chip semiconductor device. Here, an arbitrary electric potential of the marking for alignment 43 can be fixed by electrically coupling to the power line or GND line through the interconnect layer or the bump on the chip, though it is not shown in the figures. By fixing the electric potential of the marking for alignment 43, the noise emitted when the multi-chip semiconductor device is in operation can be reduced.

Figure 8:
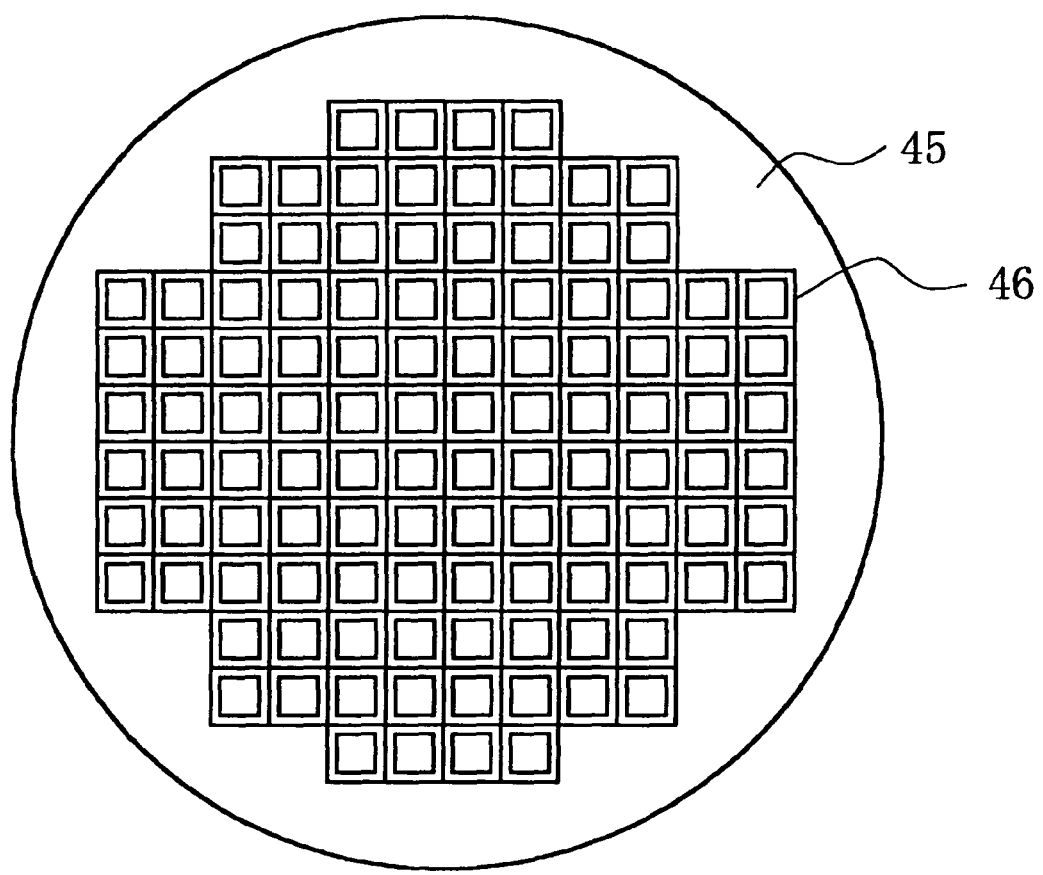
FIG. 8 is a schematic plan view of the die-on-wafer, formed by stacking chips with the bonding apparatus for the chip for the multi-chip semiconductor device shown in FIGS. 6A to 6C.

FIG. 8 is a plan view, illustrating the multi-chip semiconductor device having a configuration comprising chips stacked on a wafer. More specifically, FIG. 8 illustrates the configuration of arranging discrete chips 46 on a wafer 45 corresponding to the lower chip and stacking the chips. As such, the lower chip itself is not necessary to be a discrete chip, and the wafer 45 as it is can also be applied. The dicing can be carried out after the multi-chip module is completed by arranging the discrete chips 46 on the wafer 45 and stacking the discrete chips. Moreover, the present embodiment can also be applicable in the case where both of the upper chip and the lower chip may not be discrete chips and a plurality of wafers are stacked as they are.

Alternatively, the bonding apparatus for the chip for the multi-chip semiconductor device according to the above-mentioned embodiments can also be applied in the case of stacking multiple active elements to form a multiple-layered body (three layers or more), or in the case of stacking the substrates having no active element such as a spacer having though electrodes and the like mounted thereon.

Such embodiments will be described as follows.

Figure 9:
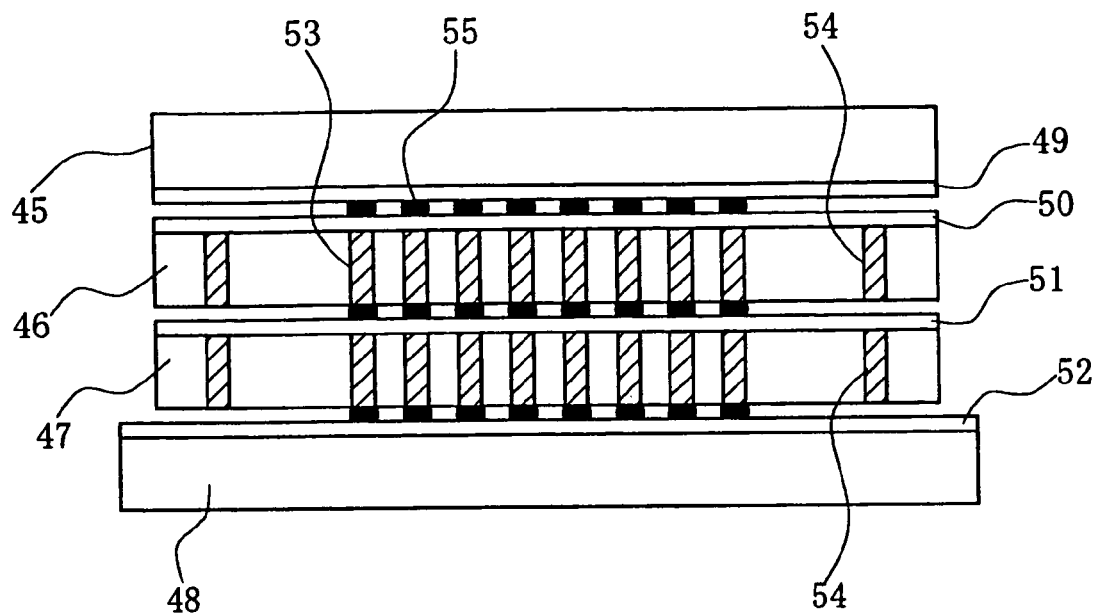
FIG. 9 is a schematic cross-sectional view of the multi-chip semiconductor device formed by stacking chips to form a quadruple-layered body with the bonding apparatus for the chip for the multi-chip semiconductor device shown in FIGS. 6A to 6C.

FIG. 9 is a cross-sectional view, illustrating a configuration of a multi-chip semiconductor device where multiple active elements are stacked to form a multiple-layered body.

The cross-sectional view illustrates a configuration of stacking chips 45 to 48 to form a quadruple-layered body, and being free of electroconductive through plug for the top chip 45 and the bottom chip 48. The chip 46 and the chip 47 corresponding to middle layers comprise electroconductive through plugs 53 and markings for alignment 54. In addition, the chip 45 and the chip 46 are electrically coupled via the bump 55, while an element formed surface (active surface) 49 and an element formed surface 50 are mutually opposed.

Further, the chips 46 through 48 are electrically coupled via the bumps 55 in a condition, while the respective element formed surfaces 50 through 52 are oriented in the same orientation (in upward direction in the figure).

Such a multiple layered structure can be applicable to a multi-layered stack of similar types of memories, a multi-layered stack of different types of memories, a mixed-mounting stack with memories and logic circuits, a multi-layered stack of logic circuits having different functions, and a multi-layered stack of LSI chips having different substrates (Si and a compound semiconductor or the like).

As such, when the number of the stacked layers of the chips exceeds three layers, the alignment of finer than 1 μm is essential on the front surface and the back surface of the chip, and if the chip comprises a marking for alignment 54 of the above-mentioned embodiments, the alignment thereof can precisely be conducted, and furthermore the available number of the layers is not limited.

Figure 10:
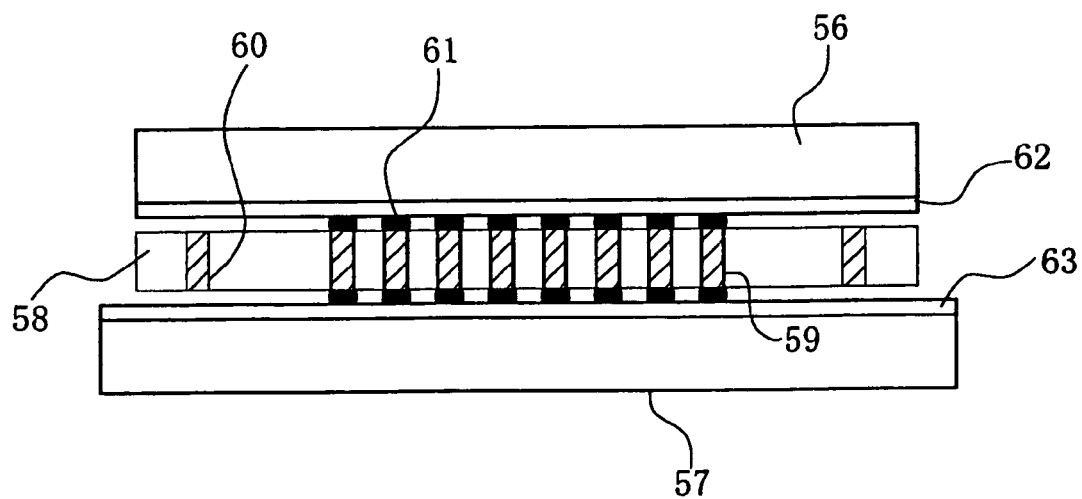
FIG. 10 is a schematic cross-sectional view of the multi-chip semiconductor device formed by stacking a spacer having though electrodes with the bonding apparatus for the chip for the multi-chip semiconductor device shown in FIGS. 6A to 6C.

FIG. 10 is a cross-sectional view, illustrating a configuration of a multi-chip semiconductor device, comprising stacked substrates, which are free of an active element mounted thereon such as spacers having through electrodes and the like.

A multi-chip semiconductor device shown in FIG. 10 comprises a chip for the multi-chip semiconductor device 57, a spacer having through electrodes 59 and a chip for the multi-chip semiconductor device 56, all of which are layered in the described order from the bottom and are electrically coupled via bumps 61. An element formed surface 62 and an element formed surface 63 provided in the chip for the multi-chip semiconductor device 56 and the chip for the multi-chip semiconductor device 57, respectively, are located on the respective sides thereof facing to the spacer having through electrodes 58 of the middle layer.

Here, the spacer having through electrodes 58 indicates a semiconductor chip having an element other than transistors (passive components such as interconnect, capacitor, inductor, antenna and the like) mounted thereon. In addition to above, an asymmetric two-dimensional arrangement of the markings for alignment 60 can be utilized for the chips having the front and the back surfaces that are difficult to be distinguished, as the spacer having through electrode 58 shown in FIG. 10. Having such configuration, the spacer having through electrode 58 can be more definitely mounted at the predetermined position without mistaking the front surface of the spacer having through electrode 58 for the back surface thereof.

Figure 11:
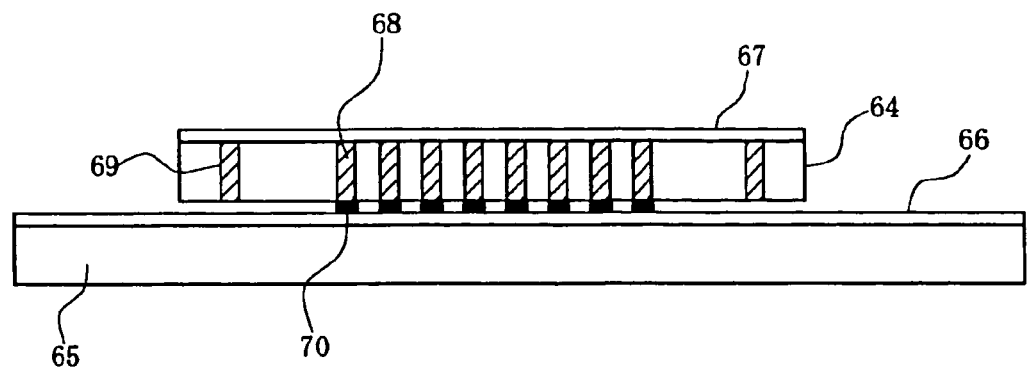
FIG. 11 is a schematic cross-sectional view of the multi-chip semiconductor device formed by stacking an optical device with the bonding apparatus for the chip for the multi-chip semiconductor device shown in FIGS. 6A to 6C.

FIG. 11 is a cross-sectional view, illustrating an embodiment of having an optical device mounted on a LSI chip.

The multi-chip semiconductor device shown in FIG. 11 comprises a chip for the multi-chip semiconductor device 64 having an optical device mounted on the chip, and has a configuration, in which these are electrically coupled at predetermined positions by the bumps 70. The chip 64 having the optical device mounted thereon comprises electroconductive thorough electrodes 68 and markings for alignment 69. An element formed surface 66 of the chip for the multi-chip semiconductor device 65 and a photo acceptance/light emitter surface 67 of the chip 64 having the optical device mounted thereon are provided on the same side thereof (upper side in the figure).

In the case of semiconductor device having the configuration shown in FIG. 11, the markings for alignment 69 are required on the back surface even in the case of dual layer-assembly, since the semiconductor device can not have a configuration of the face down bonding due to a functional difficulty. Even in employing such devices, markings for alignment 69 can be formed on the back surface of chip 64 in the processing from the front surface of the chip by using the configuration described in the above-mentioned embodiments, and thus the present embodiment is also effective in such case.

Figure 12:
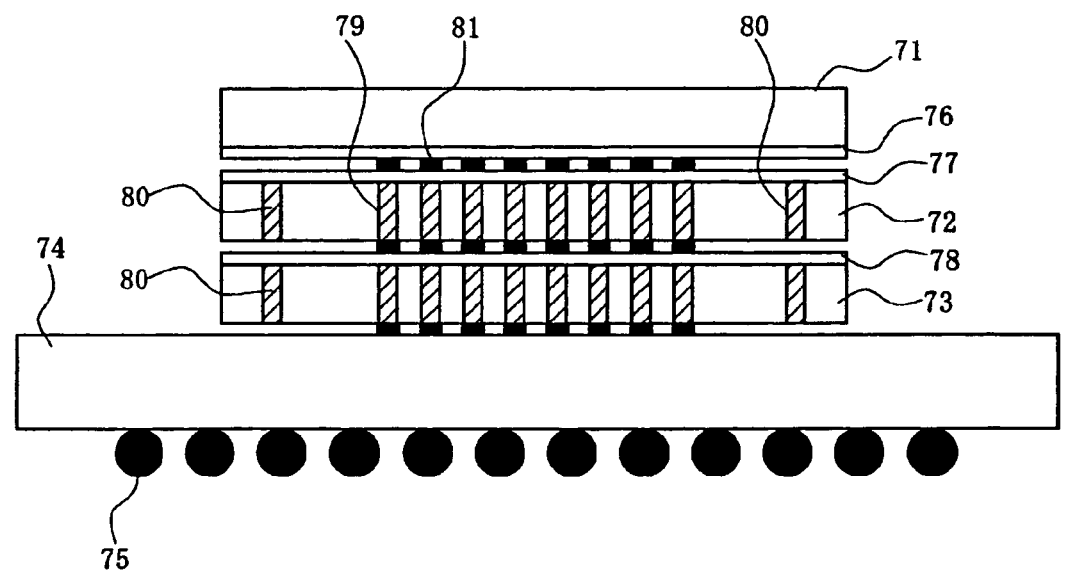
FIG. 12 is a schematic cross-sectional view of the multi-chip semiconductor device formed by stacking chips including the bottom chip also having though electrodes with the bonding apparatus for the chip for the multi-chip semiconductor device shown in FIGS. 6A to 6C.

FIG. 12 is a cross-sectional view, illustrating an embodiment where the bottom chip also has a through electrode.

Here, an example of packaging chips into a Flip Chip Ball Grid Array (FCBGA) type package is illustrated. A multi-chip semiconductor device shown in FIG. 12 comprises, on a FCBGA substrate 74, a chip for the multi-chip semiconductor device 73, a chip for the multi-chip semiconductor device 72, and a chip for the multi-chip semiconductor device 71, all of which are arranged in the described order from the bottom and are electrically coupled via bumps 81. The chip for the multi-chip semiconductor device 72 corresponding to a bottom layer and the chip for the multi-chip semiconductor device 73 corresponding to a middle layer comprise electroconductive through plugs 79 and alignment markings 80. An element formed surface 76 and an element formed surface 77 of the chip for the multi-chip semiconductor device 71 and the chip for the multi-chip semiconductor device 72, respectively, are mutually opposed. In addition, an element formed surface 78 of the chip for the multi-chip semiconductor device 73 and an element formed surface 77 of the chip for the multi-chip semiconductor device 72 are provided on the same side thereof (upper side in the figure). Further, a solder ball 75 is provided on the back surface of the FCBGA substrate 74.

In FIG. 12, the markings for alignment 80 are utilized for the alignment of the bottom semiconductor chip 73 and the FCBGA substrate 74. In addition to above, "FCBGA" is an abbreviation of Flip Chip Ball Grid Array, and is a type of a package that promotes a packaging in multiple-pins and finer pitches.

The chips for the multi-chip semiconductor device illustrated in the above-mentioned embodiments comprise the markings for alignment, and the chip can be aligned using such markings for alignment at an alignment accuracy level of finer than 1 μm. The available number of the layers for stacking chips to form a multiple-layered body is not limited, and the arrangement can be conducted at an accuracy level of finer than 1 μm. While the present invention has been described in reference to the preferred embodiments, it is apparent to those skilled in the art that the disclosures contained herein are for the purpose of illustrating the present invention only, and other various configurations of the structures or processes may be suitably employed without departing from the scopes and spirits of the invention.

For example, while the above-mentioned embodiments illustrate the cases of providing the alignment markings to the chip having the silicon substrate, the configurations described in the above-mentioned embodiments may also be generally applicable to other types of semiconductor chips, substrates or the like that are required to conduct the alignment at higher accuracy. Alternatively, the configurations described in the above-mentioned embodiments may also be applicable to compound semiconductor substrates or optical circuit substrates (silicon, quartz).

It is apparent that the present invention is not limited to the above embodiment, which may be modified and changed without departing from the scope and spirit of the invention.

What is claimed is:

1. A method for aligning a manufactured chip for a multi-chip semiconductor device, comprising:

providing a manufactured chip having a first via and a second via, the first via comprising a cross-section having a shape which is different than a shape of a cross-section of said second via, and the first and second vias being filled with an electroconductive material to form first and second through plugs, respectively, said first through plug including a cross-section having a geometric shape which is different from a geometric shape of a cross-section of said second through plug such that said first through plug is visually distinct from said second through plug in a plane view on at least one of a front surface and a back surface of said chip;

aligning said manufactured chip for said multi-chip semiconductor device using said first through plug as a marking for alignment; and stacking said manufactured chip for said multi-chip semiconductor device.

2. The method according to claim 1, further comprising:

coupling a first conductive member provided on a first surface of said manufactured chip to a second conductive member provided on a second surface opposite said first surface of said manufactured chip by using said first through plug as said marking for alignment.

3. The method according to claim 1, wherein said first and second through plugs are visually distinctive from one another in a plane view on said front surface and said back surface of said manufactured chip.

4. The method according to claim 1, wherein said first through plug employed as said alignment mark comprises a same geometry on a front surface and a back surface of said manufactured chip.

5. A method for manufacturing a chip for a multi-chip semiconductor device, said method comprising:

etching a chip for said multi-chip semiconductor device to form a first via and a second via, said first via comprising a cross-section having a shape which is different than a shape of a cross-section of said second via;

filling said first and second vias formed in said etching said chip with an electroconductive material to form first and second through plugs, respectively, said first through plug including a cross-section having a geometric shape which is different from a geometric shape of a cross-section of said second through plug such that said first through plug is visually distinct from said second through plug in a plane view on at least one of a front surface and a back surface of said chip; and exposing said first and second through plugs by removing a back surface of said chip for said multi-chip semiconductor device;

wherein said first through plug is employed as a marking for alignment.

6. The method according to claim 5, further comprising:

forming an insulating film on one of said front surface and said back surface of at least one of said first and second through plugs.

7. The method according to claim 5, wherein said first through plug employed as said marking for alignment comprises a same geometry on a front surface and a back surface of said manufactured chip.

8. A method for manufacturing a chip for a multi-chip semiconductor device, said method comprising:

etching a manufactured chip for a multi-chip semiconductor device to form a first via and a second via, the first via comprising a cross-section having a shape which is different than a shape of a cross-section of said second via; and filling said first and second vias with an electroconductive material to form first and second through plugs, respectively, which go through from one side of the manufactured chip to another side of the manufactured chip, said first through plug including a cross-section having a geometric shape which is different from a geometric shape of a cross-section of said second through plug such that said first through plug is visually distinct from said second through plug in a plane view on at least one of a front surface and a back surface of said chip such that said first through plug is usable as an alignment mark.

9. The method according to claim 8, wherein said first through plug is visually distinct from said second through plug in a plane view on said a front surface and said back surface of said manufactured chip.

10. The method according to claim 8, wherein said alignment mark comprises:

a visibly identifiable two-dimensional geometry.

11. The method according to claim 8, wherein said alignment mark is configured to provide a same geometry on a front surface and a back surface of said manufactured chip.

12. The method according to claim 8, wherein said alignment mark comprises plural first through plugs having at least one of an asymmetric geometry and an asymmetric arrangement.

13. The method according to claim 8, wherein said first through plug comprises a cross-section having a minimum width which is equal to or less than a minimum width of said second through plug.

14. The method according to claim 8, further comprising:

covering one of a front surface and a back surface of said first through plug which is usable as said alignment mark with an insulating material.

15. The method according to claim 8, wherein an electric potential of at least a portion of said first through plug which is usable as said alignment mark is fixed.

* * * * *